United States Patent
Rieken

(10) Patent No.: US 11,543,440 B2
(45) Date of Patent: *Jan. 3, 2023

(54) FRAMEWORK FOR FAULT DETECTION AND LOCALIZATION IN POWER DISTRIBUTION NETWORKS

(71) Applicant: Aclara Technologies LLC, St. Louis, MO (US)

(72) Inventor: David W. Rieken, St. Peters, MO (US)

(73) Assignee: Aclara Technologies LLC, St. Louis, MO (US)

( * ) Notice: Subject to any disclaimer, the term of this patent is extended or adjusted under 35 U.S.C. 154(b) by 83 days.

This patent is subject to a terminal disclaimer.

(21) Appl. No.: 16/702,049

(22) Filed: Dec. 3, 2019

(65) Prior Publication Data

US 2020/0182917 A1   Jun. 11, 2020

Related U.S. Application Data

(63) Continuation of application No. 15/088,971, filed on Apr. 1, 2016, now Pat. No. 10,495,672.

(60) Provisional application No. 62/142,791, filed on Apr. 3, 2015.

(51) Int. Cl.
    *G01R 19/25*   (2006.01)
(52) U.S. Cl.
    CPC .............................. *G01R 19/2513* (2013.01)
(58) Field of Classification Search
    CPC .................................................. G01R 19/2513
    See application file for complete search history.

(56) References Cited

U.S. PATENT DOCUMENTS

| | | | |
|---|---|---|---|
| 6,223,286 B1* | 4/2001 | Hashimoto | H04L 12/1868 380/280 |
| 6,611,794 B1* | 8/2003 | Fleming-Dahl | H04L 27/001 702/191 |
| 7,684,441 B2 | 3/2010 | Bickel et al. | |
| 8,928,170 B2 | 1/2015 | Rieken | |
| 9,294,147 B2 | 3/2016 | Rieken et al. | |
| 9,318,920 B2 | 4/2016 | Vukojevic | |
| 10,001,518 B2* | 6/2018 | Cheim | G01R 19/2513 |

(Continued)

FOREIGN PATENT DOCUMENTS

WO    2006113965    11/2006

OTHER PUBLICATIONS

Abdelaziz, A.Y. et al., Line Outage Detection Using Support Vector Machine (SVM) Based on the Phasor Measurement Units (PMUs) Technology, IEEE (2012), 8 pages.

(Continued)

*Primary Examiner* — Hyun D Park
(74) *Attorney, Agent, or Firm* — Michael Best & Friedrich LLP

(57) ABSTRACT

Systems and methods for detecting faults in a power distribution network are described. In an aspect, the systems and methods determine a probability that each node of the network is powered and a probability that each distribution line in the network is faulted. In another aspect, the systems and methods determine the probabilities by transmitting a signal over a power distribution network with an active sounding system. In an additional aspect, the systems and methods determine the probabilities by utilizing collected data coupled to the power distribution network.

20 Claims, 4 Drawing Sheets

(56) References Cited

U.S. PATENT DOCUMENTS

| | | | |
|---|---|---|---|
| 2003/0006883 A1* | 1/2003 | Kim | H04B 3/54 |
| | | | 714/776 |
| 2003/0158677 A1 | 8/2003 | Swartztrauber | |
| 2004/0263147 A1 | 12/2004 | Piesinger | |
| 2007/0003146 A1* | 1/2007 | Ko | G08B 25/009 |
| | | | 382/224 |
| 2007/0223165 A1* | 9/2007 | Itri | H04M 3/18 |
| | | | 361/115 |
| 2008/0222068 A1 | 9/2008 | Bahl | |
| 2011/0200836 A1 | 8/2011 | Deloach, Jr. | |
| 2013/0279546 A1 | 10/2013 | Rieken | |
| 2014/0161114 A1 | 6/2014 | Shuey | |
| 2015/0229824 A1 | 8/2015 | Tanaka et al. | |
| 2016/0091881 A1 | 3/2016 | Rieken | |
| 2016/0124421 A1 | 5/2016 | Hansell et al. | |
| 2016/0154040 A1 | 6/2016 | Driscoll et al. | |
| 2016/0198245 A1 | 7/2016 | Rhoads et al. | |

OTHER PUBLICATIONS

Bouhafs, Faycal et al., Links to the Future, IEEE Power & Energy (Jan./Feb. 2012), 9 pages.

Dasgupta, Sambarta et al., Real-Time Monitoring of Short-Term Voltage Stability Using PMU Data, IEEE Transactions on Power Systems, vol. 28, No. 4, Nov. 2013, pp. 3702-3711.

De La Ree, Jaime et al., Synchronized Phasor Measurement Applications in Power Systems, IEEE Transactions on Smart Grid, vol. 1, No. 1, Jun. 2010, pp. 20-27.

Fang, Xi et al., Smart Grid—The New and Improved Power Grid: A Survey, Communications Surveys & Tutorials, IEEE, vol. 14, No. 4, pp. 944-980 (2012).

Farhangi, Hassan, The Path of the Smart Grid, IEEE Power & Energy (Jan./Feb. 2010), pp. 18-28.

Gungor, V. Cagri et al., A Survey on Smart Grid Potential Applications and Communication Requirements, IEEE Transactions on Industrial Informatics, vol. 9, No. 1, Feb. 2013, pp. 28-42.

Hill, Cody A. et al., Battery Energy Storage for Enabling Integration of Distributed Solar Power Generation, IEEE Transactions on Smart Grid, vol. 3, No. 2, Jun. 2012, pp. 850-857.

Ju, Ping et al., Load Modeling for wide are power system, Electrical Power and Energy Systems 33 (2011) pp. 909-917.

Kschischang, Frank R. et al, Factor Graphs and the Sum-Product Algorithm, IEEE Transactions on Information Theory, vol. 47, No. 2, Feb. 2001, pp. 498-519.

Lee, Ching-Yin, Effects of Unbalanced Voltage on the Operation Performance of a Three-Phase Induction Motor, IEEE Transactions on Energy Conversion, vol. 14, No. 2, Jun. 1999, pp. 202-208.

Rieken, David W., Maximum-Likelihood Estimation of the Frequency Response of a Low Frequency Power-Line Communication Channel, IEEE (2008), pp. 228-233.

Rieken, David W. et al., Distance Effects in Low-Frequency Power Line Communications, IEEE (2010), pp. 22-27.

Rieken, David W., Periodic Noise in Very Low Frequency Power-Line Communications, IEEE International Symposium on Power Line Communications and Its Applications (2011) pp. 295-300.

Rieken, David W. et al., VLF-band Power Line Channel Sounding, 2014 18th IEEE International Symposium on Power Line Communications and Its Applications, pp. 18-23.

Tate, Joseph Euzebe et al., Line Outage Detection Using Phasor Angle Measurements, IEEE Transactions on Power Systems, Nov. 2007, pp. 1-8.

Terzija, Vladimir et al., Wide-Area Monitoring, Protection, and Control of Future Electric Power Networks, Proceedings of the IEEE, vol. 99, No. 1, Jan. 2011, pp. 80-93.

Varadarajan, Badri et al., Empirical Measurements of the Low-Frequency Power-Line Communications Channel in Rural North America, 2011 IEEE International Symposium on Power Line Communications and Its Applications, pp. 463-467.

Wu, Hongxia, PMU Impact on State Estimation Reliability for Improved Grid Security, IEEE (2006), pp. 1-3.

Xivambu, Mashangu Hudson, Impact of Floating Neutral in Distribution Systems, 19th International Conference on Electricity Distribution, Vienna, May 21-24, 2007, Paper 0300 (CIRED2007 Session 2), 4 pages.

Akankasha Eknath Pachpinde, Real Time Monitoring of Distribution Networks Using Internet Based PMU, Thesis submitted to the Faculty of the Graduate School of the University at Buffalo, State University of New York, 58 pages.

\* cited by examiner

FRAMEWORK FOR FAULT DETECTION AND LOCALIZATION IN POWER DISTRIBUTION NETWORKS

BACKGROUND

The present invention generally relates to power distribution networks and, in particular, a system and a method of efficiently detecting faults throughout the system using data analysis and probabilistic prediction techniques.

Power distribution networks often comprise many different nodes or points in the network and it is important to be able to detect when a node is powered and when a stretch of distribution line between nodes is faulted. Because the sensors used to detect the powered state at the many locations throughout the network may be noisy, it is preferable to view the state of the network at each point probabilistically. Furthermore, because of the scale of the network, computing the marginal probability density functions at each location in the graph is most often computationally impractical.

SUMMARY

In one form, a system for detecting faults in a power distribution network is described. The system includes data input devices coupled to the power distribution network, the data input devices receiving data from the power distribution network. A memory device is coupled to the one or more data input devices comprising a data management module that stores the received data from the one or more data input devices. A processing device comprising a processor is coupled to the memory device. The processing device comprising processor executable instructions for determining, based on the received data, a first estimated probability that each node of a plurality of nodes of the power distribution network is powered and determining, and a second estimated probability that each distribution line of a plurality of distribution lines connecting the plurality of nodes is faulted. The processing device further comprising processor executable instructions for assigning a visual characteristic to each node of the plurality of nodes based on the first estimated probability for the corresponding node and to each distribution line of the plurality of distribution lines based on the second estimated probability for the corresponding distribution line.

In another form, a method for detecting faults in a power distribution network is described. A signal is transmitted to a plurality of nodes in the power distribution network and received by the plurality of nodes in the power distribution network. One or more nodes of the plurality of nodes are monitored to determine a detection status of the transmitted signal. Using the detection status, a first estimated probability is calculated for each node in the power distribution network and a second estimated probability is calculated for each distribution line in the power distribution network. The first estimated probability indicating the likelihood that the nodes are powered and the second estimated probability indicating the likelihood that the distribution lines are not faulted.

Other objects and features will be in part apparent and in part pointed out hereinafter.

BRIEF DESCRIPTION OF THE DRAWINGS AND APPENDIX

Figure 1:
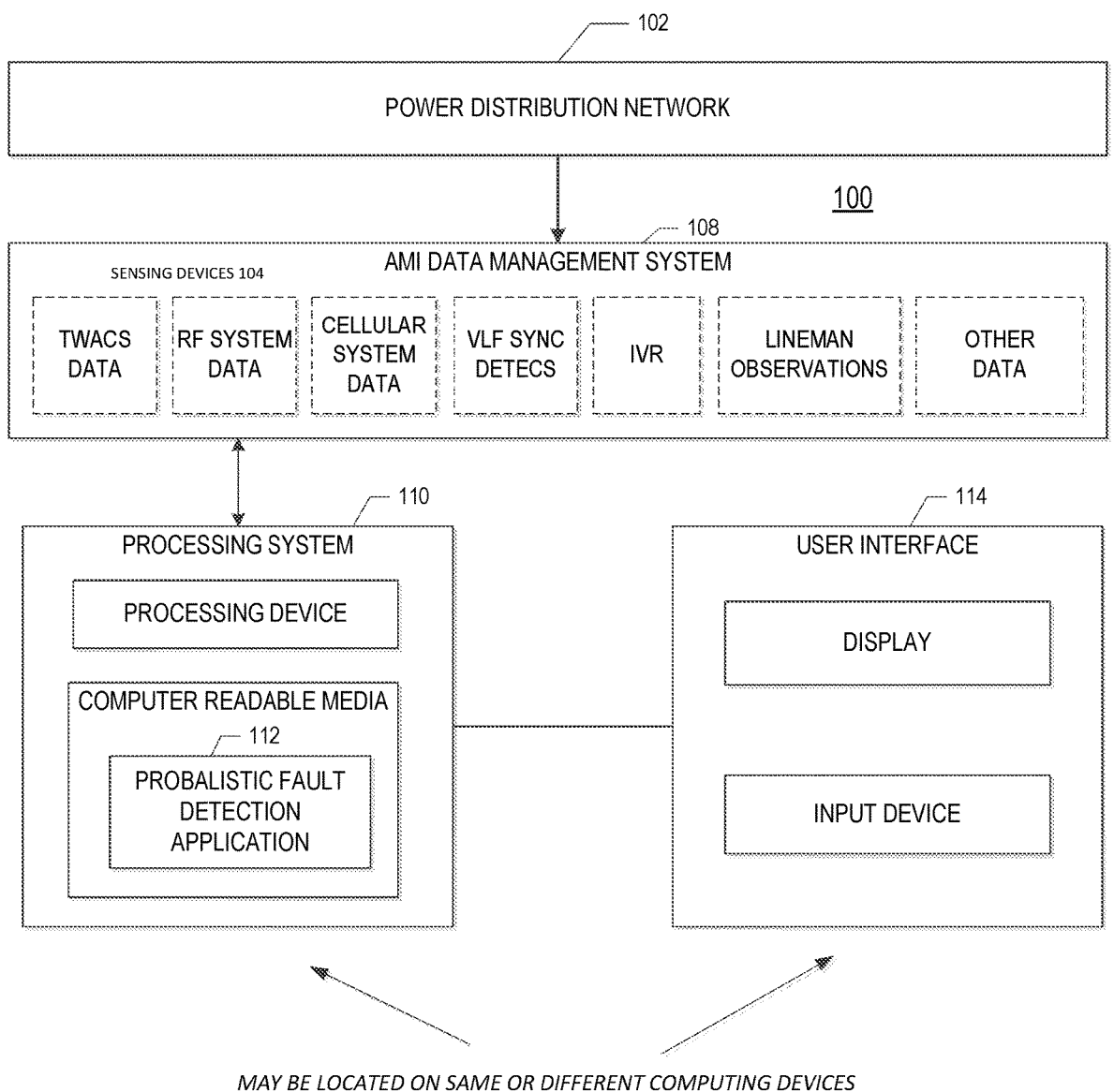
FIG. 1 is a block diagram showing the power distribution network and the connected devices and systems for implementing the described invention.

APPENDIX A illustrates the mathematical basis for the sum-product algorithm as described and it provides a pseudo code implementation of the algorithm.

Corresponding reference characters indicate corresponding parts throughout the drawings.

DETAILED DESCRIPTION

The described system connects to and receives data from a power distribution network. The system uses the received data to determine important information about the functionality of the network. FIG. 1 shows a block diagram 100 of the power distribution network 102, sensing devices 104, a data management system 108, a processing system 110, and a user interface 114. The processing system 110 includes a probabilistic fault detection (PFD) application 112. In the diagram 100, the sensing devices 104 are mechanically, electrically, and/or communicatively connected to aspects of the network 102. As illustrated in FIG. 1, the sensing devices (i.e., sensors) 104 (e.g. TWACS data, RF System Data, etc.) can be part of the data management system 108, although other configurations are also contemplated. The sensing devices 104 are also communicatively connected to the data management system 108, which is in turn communicatively connected to the processing system 110. The processing system is also electrically and/or communicatively connected to the user interface 114. In one form, the sensing devices 104 collect data that are not statistically independent of the state of the power distribution network 102 and relay that data to the PFD application 112. Thus, the sensing devices 104 need not be attached to the network in any way.

In an embodiment, the primary method of gathering data from the power distribution network 102 is through the use of sensing devices 104 connected to the network 102. The sensing devices 104 may be connected to the network 102 at the transmission lines, the distribution lines, the power substations, the power meters, or any other point that makes up the power distribution network 102. The system and method herein is described at the distribution level. However, the system and method herein can be generalized to transmission lines and, as used herein, transmission lines includes distribution lines. In an embodiment, the data collected by the sensing devices 104 comprises direct power data and data values which are indicative of the state of the network point to which the devices 104 are connected. In one embodiment, a sensing device (i.e., sensor) 104 is anything that provides data that is not statistically independent of the powered state of the network 102. Sensing devices 104 need not be connected to the network 102. As indicated in FIG. 1, customer calls and linemen observations are considered sensors for purposes of this system. Exemplary sensing devices 104 include, but are not limited to, those that detect electrical quantities, including voltage, electric current, electrical resistance, electrical conductance, electrical reactance, susceptance, magnetic flux, electrical power, inductance, capacitance, electrical impedance, electrical admittance, phase characteristics, frequency, gain, consumption, demand, time-of-use, reactive energy, power factor, Q-hour, apparent power, and the like. Exemplary sensing devices 104 that are indicative of the state of the network include customer calls, communication link data, thermal imagery of distribution lines, transient detectors, and the like. The sensing devices 104 are adapted to transmit data via a communication network. The communication network may be any network that facilitates the exchange of data, such as those that operate according to the IEEE 802.3 protocol (e.g., Ethernet), the IEEE 802.11 protocol (e.g., Wi-Fi), or the IEEE 802.16 protocol (e.g., WiMAX), for example. In another embodiment, the communication network is any medium that facilitates the physical transfer of data through serial or parallel communication channels (e.g., copper, wire, optical fiber, computer bus, cellular/wireless communication channel, radio frequency network, etc.).

According to one aspect, the data collected from the sensor 104 can include very low frequency (VLF) sync detection data, interactive voice response (IVR) data, lineman observation data, magnetic induction data, Supervisory Control and Data Acquisition (SCADA) data, infrared imagery data, and other data.

VLF sync detection data corresponds to responses that are detected or measured at targeted sites within the power distribution network 102 after one or more VLF band signals have been injected into the network 102. The process of detecting responses after injecting VLF band signals is described below in more detail.

IVR data includes data collected via an automated telephony system that interacts with callers to receive or gather information and/or route calls to an appropriate recipient. IVR data can be received through voice telephone input and/or touch-tone keypad selections.

For example, a lineman may use a data input device to record and communicate information about characteristics or properties of network 102.

Magnetic induction data includes data collected via a magnetic field sensing device. For example, the magnetic field sensing device may be a portable device that generates a measurable current when placed or positioned within a certain distance of an active or live power line.

Infrared (IR) imagery data includes data collected using an infrared sensing device. For example, the infrared sensing device senses whether the temperature of a particular component or equipment (e.g., switches, connectors, etc.) within the network 102 has exceeded a threshold temperature and, thus, is indicative of component or equipment failure. In one embodiment, the infrared sensing device measures the temperature of the conduction material to determine the current flowing through it.

Supervisory Control and Data Acquisition (SCADA) data corresponds to data acquired or collected through a SCADA system.

According to another aspect, the power distribution network 102 and/or the sensing devices 104 are components of an advanced metering infrastructure (AMI) system and the data management systems 108 collects and stores AMI data. The AMI data stored by the data management system includes, for example, Two-Way Automated Communication System (TWACS) data, Radio Frequency (RF) system data, and/or cellular system data.

TWACS data includes in-bound and/or out-bound messages that are communicated through power lines between substation communication equipment and remote communication equipment, such as a meter at a customer site. Outbound messages typically are used to check on the status of the power usage at the customer site (polling), convey instructions related to power usage at the site, etc. Inbound messages provide information or data about power usage at the customer site.

RF system data includes message data transmitted over a radio frequency between components of a smart power distribution network. For example, meters located at customer sites are equipped with a communication module that enables each meter to generate and transmit data via a RF communication signal to one or more components of the smart power distribution network.

Cellular system data includes data communicated between components of a smart power distribution network through a cellular communication network. For example, meters located at customer sites are equipped with a communication module that enables each meter to communicate data to one or more components of the smart power distribution network through a cellular communication infrastructure.

The processing system 110 connects to the data management system 108. For example, processing system 110 may be electrically connected to data management system 108 or communicatively connected via a communication network, such as those further described herein. The processing system 110 receives the data from the data management system 108 and processes it into useful information, which is then used to make decisions about the operation of the power distribution network 102. In an embodiment, the processing system 110 comprises a probabilistic fault detection application 112 stored on computer readable media for determining the probability that points within the network 102 are powered or faulted, as further described herein. For example, the probabilistic fault detection application 112 may be embodied as processor-executable instructions on the computer readable medium and execution of the instructions by a processing device of the processing system 110 provides a determination of the probability that points within the network 102 are powered or faulted. In an embodiment, the processing system 110 is further connected to a user interface 114 which enables users to view the results of the data processing of the processing system 110 via a display device and to interact with the system as a whole in response to the data processing. The processing system 110 and the user interface 114 may be embodied on the same computing device or on separate computing devices.

Figure 2:
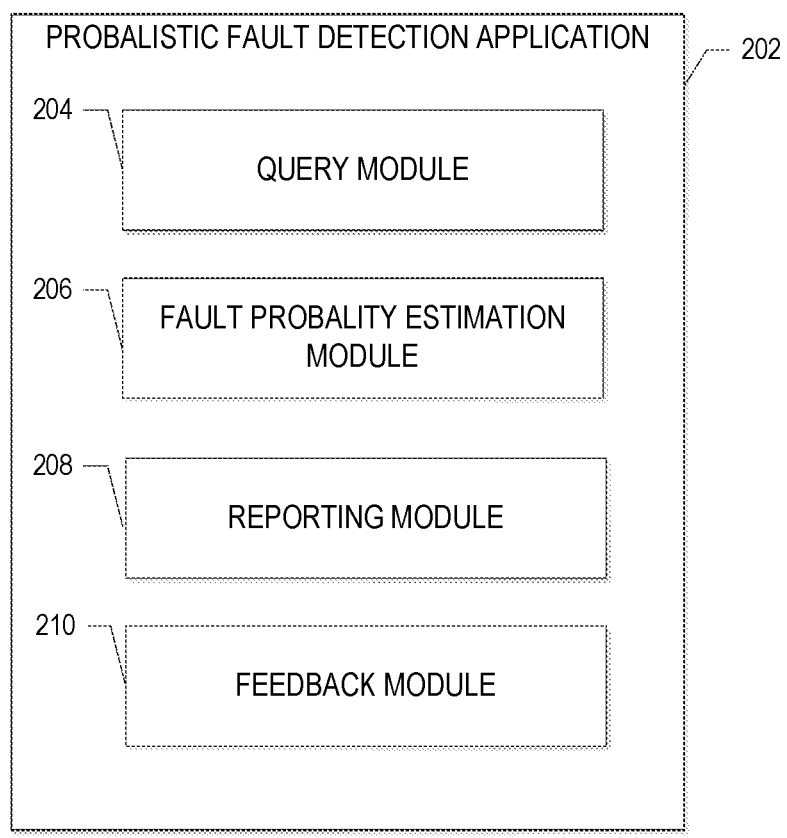
FIG. 2 is a block diagram showing the modules making up the probabilistic fault detection application.

The probabilistic fault detection (PFD) application 112 is a vital part of the described invention. FIG. 2 is a block diagram 200 representative of an exemplary PFD application 202 and the components thereof. In an embodiment, the PFD application 202 comprises a query module 204, a fault probability estimation module 206, a reporting module 208, and a feedback module 210. The four modules work in conjunction to interpret data gathered from the sensors 104 to provide information about the state of various points of the network. The query module 204 connects to the data management system 108 and is adapted to query for data and retrieve the data for use by the fault probability estimation module 206. The query module 204 may query the data management system 108 at regular intervals to ensure the most current data is being used. In an embodiment, query module 204 comprises processor-executable instructions embodied on the computer readable medium of processing system 110 to provide the query module 204 via a software environment. In an embodiment, query module 204 is adapted to retrieve data from data management system 108 by transmitting a query to data management system 108, which data management system 108 receives and uses to select stored data that satisfies the query. The data management system 108 then transmits the selected data to probability estimation module 206.

The probability estimation module 206 receives the data provided by the query module 204 and analyzes the data to generate probabilistic information about the state of points within the power distribution network 102. In an embodiment, the probability estimation module 206 executes an algorithm on the data in order to generate the results (e.g., probabilistic information). This algorithm is described further below and in Appendix A. This algorithm corresponds to a means for estimating fault probability, according to some embodiments. In an embodiment, probability estimation module 206 comprises processor-executable instructions embodied on the computer readable medium of processing system 110 to provide the probability estimation module 206 via a software environment.

The reporting module 208 takes the generated probabilistic information from the probability estimation module 206 and generates reports containing the information. The reports are generated in such a way as to provide the probabilistic information to users of the system in a useful and understandable way when displayed via a display device. In an embodiment, reporting module 208 comprises processor-executable instructions embodied on the computer readable medium of processing system 110 to provide the reporting module 208 via a software environment.

The feedback module 210 provides feedback to the data collection mechanisms (e.g., sensing devices 104) regarding nodes that should be targeted for data collection. In an embodiment, feedback module 210 uses computed probabilistic information to guide the data collection process for points within the power distribution network 102. For example, computed probabilities between very near 0 and very near 1 are reflective of certainty in the state of the network 102. Those nodes or groups of nodes with uncertain states (i.e. those nodes with computed probabilities not near 0 or 1) are targeted for data collection. In an embodiment the probability that a given node is targeted for data collection is proportional to the entropy of the computed probability of its state. This forms a feedback loop from the probability computation to the data management system 108. Among the advantages of this approach are that the computed probabilities detect regions of the network 102 for which the presently available data are insufficient. In an embodiment, feedback module 210 comprises processor-executable instructions embodied on the computer readable medium of processing system 110 to provide the feedback module 210 via a software environment.

According to another aspect, feedback module 210 generates and sends commands to the sensing devices 104 to collect data from one or more nodes neighboring a particular node with uncertain states. For example, if computed probabilities associated with a particular node are indicative of an uncertain state with respect to the status of that node, the feedback module 210 may command one or more data sensing devices to compute probabilistic information about nodes that are adjacent to and/or neighbor that particular node.

According to another aspect, the feedback module 210 associates or assigns a visual characteristic to elements of a distribution map (e.g., see FIG. 3) being displayed, for example, via the user interface 114. The visual characteristic may be a color, a symbol, text, or some other indicator that conveys the state of a particular node or edge within the power distribution network. For example, if the visual characteristic is a color, red may indicate a fault state, green may indicate an active or powered state, and yellow may indicate an uncertain state. In an embodiment, the feedback module 210 associates or assigns a first type of visual characteristic (e.g., color) to nodes and a second type of visual characteristic (e.g., text) to transmission lines. In another embodiment, the feedback module 210 associates or assigns a common visual characteristic to nodes and transmission lines (e.g., color for both, text for both, etc.).

Figure 3:
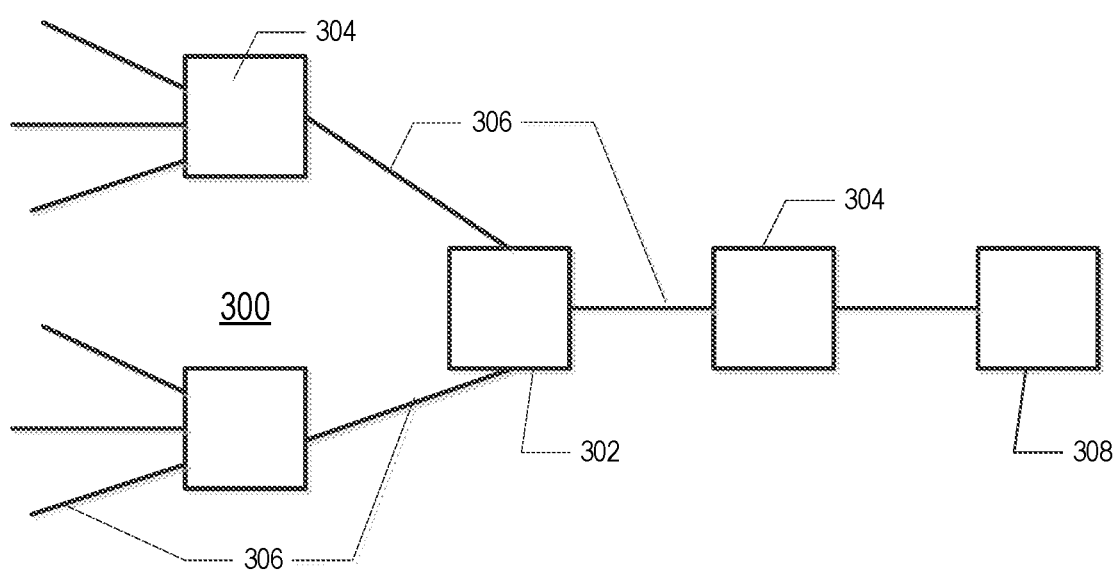
FIG. 3 is a diagram of nodes and edges representative of a power distribution network.

FIG. 3 shows a diagram of an exemplary power distribution network map 300 with nodes or vertices 302, 304, and 308 representing any electrical devices, branches, or other points on the network 102 and edges 306 representing the distribution lines connecting those points. In an embodiment, this representation is used by the PFD application 202 to determine probability states for each node 302, 304, and 308 and each edge 306. The diagram shows a node 302 at the center connected to adjacent nodes 304 by edges 306. The adjacent nodes have additional edges 306 that may connect to additional nodes not shown. It is important to be able to determine if the nodes of the network are powered and whether the distribution lines of the network are faulted or not.

In an embodiment, a power distribution network has at least one node which is a source node 308, which may be representative of a power substation, generator, or the like. The source node 308 is a node which provides power from outside the network to the nodes of the network via the distribution lines 306. A particular node 302 can only be powered if the distribution lines 306 between the source node 308 and the particular node 302 are not faulted and if the nodes between the source node 308 and the particular node 302 are powered. If the particular node 302 and the source node 308 are adjacent in the network and connected only by a single distribution line 306, then the distribution line 306 between them must not be faulted for node 302 to be powered. Depending on the complexity of the network, a node may be powered from the source node along more than one path through the network.

Data is gathered from the power distribution network which is correlated with power loss at nodes in the network. In an embodiment, the data gathered is stochastic in nature in that the data is randomly determined, having a random probability distribution or pattern that can be analyzed statistically but may not be predicted precisely. In one form, the data is correlated with power loss at nodes in a probabilistic way, not a purely deterministic way. The gathered data may be in the form of signals passed between nodes throughout the power distribution network. In an embodiment, the power distribution network comprises an active sounding system as described in U.S. patent application Ser. No. 62/057,300. A very low frequency (VLF) band signal is transmitted throughout the network and received at each node in the network in varying patterns. In an embodiment, the signal is a VLF-band spread spectrum signal followed by a VLF-band communications message signal ("signal") encoded with a unique identifier. When a concentrator device broadcasts a particular signal on the network, it also reports to a central processing station that it broadcast that particular signal with the unique identifier at that particular time. When a detector device detects the broadcasted signal, it decodes the signal and notifies the central processing station that it received a signal with the unique identifier. The central processing station can use a detection status of a transmitted signal to estimate the probability that each node in the network is powered and/or the probability that each stretch of distribution line is faulted. The detection status for a particular transmitted signal is, for example, a value, flag, or other attribute that indicates whether that particular transmitted signal was detected by the detection device.

According to one aspect, the central processing station can determine a detection rate for each detector device based on what percentage of broadcast signals they report receiving. The detection rate of the signal at each node constitutes a random process which contains information on the state of the network. In the event that a fault occurs in the network, the detection rate of the signal at affected nodes changes. The detection rate data gathered is used to estimate the probability that each node in the network is powered and the probability that each stretch of distribution line is faulted. In general, the algorithms described herein not necessarily need to compute a detection rate and wait for it to change. The relative merits of each hypothesis can re-evaluated with every detection and missed detection. In an embodiment, sensors may gather the data from the nodes of the network and/or from the distribution lines of the network. In another embodiment, the signal data as described above is passed throughout the network using TWACS communication technology. Other data sources may also be used, including SCADA data or even customer reporting data and manually entered data, so long as the data used are not statistically independent with the powered state of the network.

Figure 4:
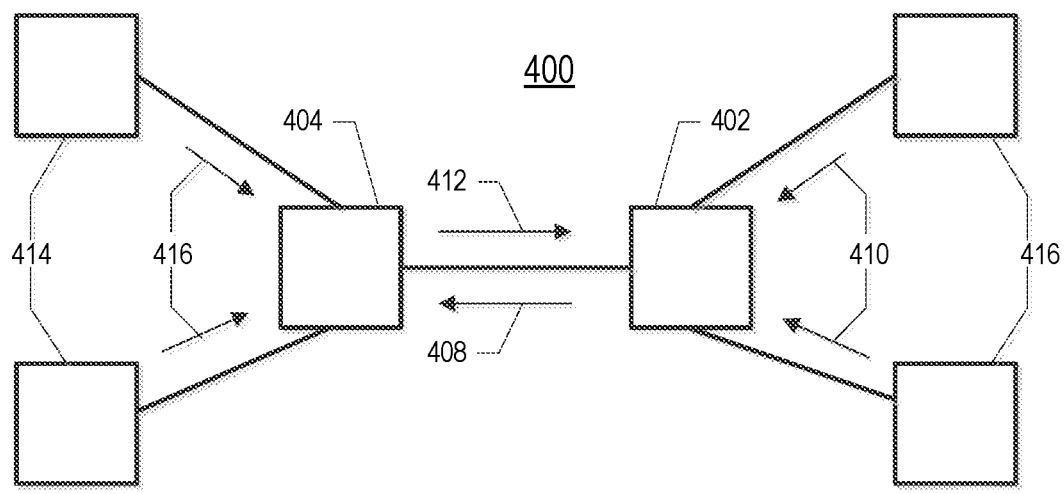
FIG. 4 is a diagram of message passing among the nodes representative of a power distribution network.

In an embodiment, the estimates of whether the nodes are powered or the distribution lines are faulted are calculated using the sum-product algorithm by the PFD application 202. Alternatively, a max-product algorithm can be used. The difference between the two is that the sum-product algorithm can be used to compute the minimal mean square error (MMSE) estimates of the state and the max-product is used to compute the maximum a-posteriori (MAP) estimates. The data are the same for both approaches, as is the structure of the message passing algorithm. One difference is in the equations used to compute the messages at each iteration of the algorithm. The nodes of the network pass messages to the other adjacent nodes and edges in the network. FIG. 4 shows a diagram of a group of nodes of a network 400 passing messages between each other. The message 408 passed from a first node 402 to a second node 404 comprises a combination of the information from the messages 410 sent to the first node 402 from all other adjacent nodes 406, not including the second node 404. Similarly, a message 412 passed from the second node 404 to the first node 402 comprises a combination of the information from the messages 416 sent to the second node 404 from all other adjacent nodes 414, not including the first node 402. In an embodiment, the messages being passed are probability density functions (PDFs) as described in Appendix A, including the Forney Factor graph as represented in FIG. 1 on page 4 of Appendix A. For a node to be powered one of the adjacent nodes must be powered and the distribution line between the two nodes must be connected. The probability that a node is powered is a function of the probabilities that the adjacent nodes are powered and the connecting distribution lines are not faulted. The messages being passed contain information about the probability that the node receiving the signal is powered. In an embodiment, the edges between the nodes also pass messages that include information about the probability that the distribution lines represented by the edges are faulted.

The data gathered from the network does not perfectly represent the state of the nodes and distribution lines. The data from a node may indicate that it is not powered when it actually is powered, or the data from the node may indicate that it is powered when it is not actually powered. The same applies for data gathered about a distribution line. The probability that the data being gathered for each node and distribution line is accurate is further used within the sum-product algorithm calculation.

The data gathered from the network may be data that is only from some of the nodes or some of the edges. A message passing algorithm such as the sum-product algorithm is implemented by the PFD application 202 to extrapolate the probabilities that apply to the other points in the network. The sum-product algorithm is an example of one fast method for computing the marginal PDF from the joint PDF of many variables. In this case, those many variables are the states of every edge and node in the power distribution graph. In one form, a belief propagation algorithm can be employed, where a message being passed from a node 402 to a node 404 contains information indicating the "belief" of the node 402 that the node 404 is powered based on the messages node 402 has received from other adjacent nodes 406 and any sort of functionality node 402 may itself provide. Belief propagation algorithms are a superset of the sum-product algorithm. They need not be rigorous. Many are heuristic. The sum-product algorithm is rigorous on graphs without loops and computes the marginal PDFs precisely. In an embodiment, aspects of the invention implement a sum-product algorithm to solve equations more quickly and efficiently than straightforward solutions. In another embodiment, aspects of the invention implement a sum-product algorithm to provide real-time updates of the faulted state of the network and alerts in less time than would otherwise be possible. The marginal PDF computed is conditioned on the detection status of every node in the network. The detection rate is a parameter of the PDF. In one embodiment, it is not estimated but considered it to be known. Other embodiments consider the detection rate an unknown nuisance parameter and estimate it by some method internal to the algorithm. See Appendix A.

In an embodiment, the data gathered is analyzed by a computer system executing the PFD application 202 and computing probabilities for each of the nodes and distribution lines, or edges, according to the sum-product or max-product algorithm calculation. The messages sent between the nodes and edges are dependent on other messages received. Due to this interdependence, the messages to send may be updated multiple times as the received messages also change. Eventually, the message values between the nodes and edges converge to stable values. In a Forney Factor graph (FFG) without cycles, the algorithm completes after a finite number of calculations, as noted in Appendix A. Once the algorithm completes or stabilizes, the message values between nodes and edges indicate the likelihood of a node in the network being powered or a distribution line in the network being connected. See Appendix A. for the algorithm pseudo code. In an embodiment, the algorithm allows aspects of the invention to fuse widely disparate sources of stochastic data and infer the state of the network. In another embodiment, the algorithm allows aspects of the invention to utilize numerous imprecise sensors to quickly deduce the probability that outages are occurring on the network and to locate the source of the problem causing the outages.

In FFGs' with cycles, the calculating and updating of the messages for each node and edge includes several different steps. These steps comprise assigning initial values to each node and edge in the network and creating initial messages from each node and edge based on the initial values. The initial values are based on the data gathered from the node or edge if available. Otherwise, the initial value is set to a positive value between 0 and 1. Based on the initial values, the algorithm iterates through the nodes and edges repeatedly, updating the messages for each.

Some variant of an iterative approach should be used on FFGs with cycles. Once the updated outgoing message components are calculated for each node in the network, the new incoming messages for each node and edge are processed and incorporated into the outgoing messages of the nodes and edges. The algorithm repeats. The algorithm loops repeatedly and may eventually converge to stable values for the messages between the nodes and edges. This approach is not necessary on FFGs without cycles.

The stable values at each point of the network represent estimations of the state of that point in the actual power distribution network. The values are then interpreted by users or other computer programs in order to determine if action needs to be taken based on the estimations. Whether a value is considered high or low is dependent on the network and the decisions of the manager of the power distribution network. In an embodiment, an additional algorithm is used to convert the estimation values at each point in the network to binary values indicating whether a given point is faulted or not.

Aspects of the invention relate to an algorithm for computing these probabilities across an entire network simultaneously using belief propagation techniques, such as an algorithm which examines the aggregate of all data collected across a network and uses it to estimate the probability that each point on the network is experiencing an outage. The algorithm is based on a Bayesian model relating the data set to the outage state of the network and relating the outage state at each point on the network to every other point on the network by a graph-based network topology. The sum-product algorithm and max-product algorithm are used to compute the minimum mean square error (MMSE) and maximum a posterior (MAP) estimates of the outage state, respectively. The results of these algorithms can also be used to identify those areas of the network for which the outage state is uncertain. Another algorithm embodying aspects of the invention directs meter interrogations to most quickly resolve those areas of ambiguity.

A pseudocode implementation of a message passing algorithm is given in algorithm 1. This function solves for an entire graph by calling the recursive functions in algorithms 2 and 3. The message passing algorithm is the same for the MAP algorithm as it is for the MMSE algorithm, with the exception that the form of the messages is different. For the MMSE algorithm:

forwardAnd$(a,b)=a+b-\ln(1+\exp(a)+\exp(b))$ backwardAnd$(a,b)=\ln(1+\exp(a+b))-\ln(1+\exp(a))$ And for the MAP algorithm:

forwardAnd$(a,b)=\min(a+b,b,a)$ backwardAnd$(a,b)=\ln(\max(1,e^{a+b})/\max(1,e^a))$ Algorithm 1. This algorithm solves for the entire graph.
   function MP$(G,v_s)$
     for $v \in V$ do
       v.color←white
     end for
     update$(v_s)$
     downdate$(v_s)$
   end function Algorithm 2. This recursive function passes messages up from the leaves.
   function UPDATE$(v,e)$
     if v.sensor then
       v.φ←dataIn$(v,d(v))$
     else if $v=v_s$ then
       v.φ←∞
     else
       v.φ←0
     end if
     v.γ←v.φ
     v.color←gray
     $[\omega,f] \leftarrow \text{Adj}(G,v)$
     for i=1 to length $(\omega)$ do
       if $\omega_i$.color=white then
         update $(\omega_i,f_i)$
         v.γ←v.γ+$\omega_i$.μ
       end if
     end for
     if $v \ne v_s$ then
       v.φ←$-\ln(1-p(e.\theta_v=0)/p(e.\theta_v=0))$
       v.μ←backwardAnd(v.ψ,v.γ)
     end if
   end function Algorithm 3. This recursive function passes messages down the tree from the vertex $\overline{v_s}$ to the leaves.
   function DOWNDATE$(v,\mu',e)$
     if $v=v_s$ then
       v.γ'←0
     else
       v.ψ'←backwardAnd$(\mu',v.\gamma)$
       e.θ←$\exp(v,\omega'+v,\psi)/1+\exp(v.\psi'+v.\psi)$
       v.γ'←forwardAnd$(\mu',v_x\psi)$
     end if
     $L_p \leftarrow v.\gamma+v.\gamma'$
     v.x←$\exp(L_p)/1+\exp(L_p)$
     v.color←black
     $[\omega,f] \leftarrow \text{Adj}(G,v)$
     for i=1 to length $(\omega)$ do
       if $\omega_i$.color=gray then
         downdate $(\omega_i,L_p-\omega.\mu,f_i)$
       end if
     end for
   end function Algorithm 4 is an algorithm for computing the message passed to the network graph based on a factor graph. The function $f$ depends on whether the MMSE or MAP is to be computed. For the MMSE:

$f(\Gamma^+) = \ln p_{01} + e^{\Gamma^+}(1-p_{10})/(1-p_{01}) + e^{\Gamma^+} p_{10}$ For the MAP estimate:

$f(\Gamma^+) = \ln(\max(p_{01}(1-p_{10})e^{\Gamma^+})/\max((1-p_{01})p_{10}e^{\Gamma^+}))$ Algorithm 4. An algorithm for computing $\overline{\phi}$.
   function DATAIN$(v,d)$
     for n=1 to N do
       if $d_n(v)=\emptyset$ then
         $\alpha_n \leftarrow 0$
       else if $d_n(v)=0$ then
         $\alpha_n \leftarrow -\ln(1-P_D(v))-\ln(1-P_{FA}(v))$
       else
         $\alpha_n \leftarrow -\ln P_D(v) - \ln P_{FA}(v)$
       end if
       if n=1 then
         $\Gamma_n^- \leftarrow 0$
       else
         $\Gamma_n^- \leftarrow f(\Gamma_{n-1}^+)$
       end if
       $\Gamma_n^+ \leftarrow \Gamma_n^- + \alpha_n$
     end for
     $\phi(v) \leftarrow \Gamma_N^+$
   end function The Abstract and summary are provided to help the reader quickly ascertain the nature of the technical disclosure. They are submitted with the understanding that they will not be used to interpret or limit the scope or meaning of the claims. The summary is provided to introduce a selection of concepts in simplified form that are further described in the Detailed Description. The summary is not intended to identify key features or essential features of the claimed subject matter, nor is it intended to be used as an aid in determining the claimed subject matter.

For purposes of illustration, programs and other executable program components, such as the operating system, are illustrated herein as discrete blocks. It is recognized, however, that such programs and components reside at various times in different storage components of a computing device, and are executed by a data processor(s) of the device.

Although described in connection with an exemplary computing system environment, embodiments of the aspects of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well-known computing systems, environments, and/or configurations that may be suitable for use with aspects of the invention include, but are not limited to, personal computers, server computers, handheld or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the aspects of the invention may be described in the general context of data and/or processor-executable instructions, such as program modules, stored one or more tangible, non-transitory storage media and executed by one or more processors or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote storage media including memory storage devices.

In operation, processors, computers and/or servers may execute the processor-executable instructions (e.g., software, firmware, and/or hardware) such as those illustrated herein to implement aspects of the invention.

Embodiments of the aspects of the invention may be implemented with processor-executable instructions. The processor-executable instructions may be organized into one or more processor-executable components or modules on a tangible processor readable storage medium. Aspects of the invention may be implemented with any number and organization of such components or modules. For example, aspects of the invention are not limited to the specific processor-executable instructions or the specific components or modules illustrated in the figures and described herein. Other embodiments of the aspects of the invention may include different processor-executable instructions or components having more or less functionality than illustrated and described herein.

The order of execution or performance of the operations in embodiments of the aspects of the invention illustrated and described herein is not essential, unless otherwise specified. That is, the operations may be performed in any order, unless otherwise specified, and embodiments of the aspects of the invention may include additional or fewer operations than those disclosed herein. For example, it is contemplated that executing or performing a particular operation before, contemporaneously with, or after another operation is within the scope of aspects of the invention.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the aspects of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

The above description illustrates the aspects of the invention by way of example and not by way of limitation. This description enables one skilled in the art to make and use the aspects of the invention, and describes several embodiments, adaptations, variations, alternatives and uses of the aspects of the invention, including what is presently believed to be the best mode of carrying out the aspects of the invention. Additionally, it is to be understood that the aspects of the invention is not limited in its application to the details of construction and the arrangement of components set forth in the following description or illustrated in the drawings. The aspects of the invention are capable of other embodiments and of being practiced or carried out in various ways. Also, it will be understood that the phraseology and terminology used herein is for the purpose of description and should not be regarded as limiting.

APPENDIX A

Abstract

Responsive, reliable outage detection in power distribution networks remains elusive. For most utilities, the most reliable method of outage detection is at least initiated by customer calls. In this paper we consider the problem of automatic outage detection from the data collected from an array of disparate sensors that are observing the network. We show that it is possible to compute the probability that any point in the network is powered at a given time and the probability that any span of distribution line on the network is interrupted. We derive an algorithm for computing these probabilities across an entire network simultaneously using belief propagation techniques. We also introduce an information-theoretic framework for collecting data so that a high-confidence result is obtained quickly.

1 Introduction

Most people are surprised to learn that their electric utility cannot reliably and automatically detect power outages. The most reliable method for outage detection continues to be phone calls from customers. Although the method in which those phone calls are interpreted may be automated, the first indication that an outage has occurred somewhere on the network, from the utility's perspective, comes when one of their customers manually informs them that they are no longer able to draw power. If a customer does not report an outage it is possible that the outage will go undetected for an unacceptably long time. The drawbacks to not having a fully automatic outage detection system are that the utility is slow to respond to the outage, potentially reducing customer confidence. It also increases cost since the utility must allocate resources, often manual resources, to finding the extent of the outage.

Sensors capable of detecting outages are installed at many utilities. Smart meters, for example, capable of determining the outage state at their location can transmit that state to the utility. However, it may be that communication bandwidth may prohibit frequent interrogation. Thus, even if an automated outage detection system were to be built on data collected from smart meters, it is likely that the detection latency would be too long. It may even be less reliable than relying on customer calls, in many cases.

An additional complication is that data provided by most (if not all) sensors are stochastic in nature. In some smart meter communication networks responses to outage interrogations are not deterministic functions of the outage state. Consider, for example, a smart meter that responds when it receives a request from its parent device. If the meter does not respond, it could be for reasons other than an outage. Signal processing and other communications errors can result in the response being lost. An algorithm interpreting these data cannot reliably conclude that an outage has occurred at a given point on the basis of a smart meter installed at the point failing to respond, alone. It can, however, make a statement about the *probability* that an outage is occurring at that point.

The statistical nature of the data and its applicability in detecting outages can be illustrated by the following example. Suppose a multiple-user outage has occurred in a particular subdivision serviced by the utility. If one meter in the affected area were to be interrogated and fail to respond, one cannot conclude that even that meter, let alone the entire subdivision, is experiencing an outage. If a second meter is interrogated, though, and it also fails to respond, the probability that both meters are experiencing an outage rises. As each meter in the subdivision is interrogated, the probability of outage can be computed with increasing certainty. The point is that the aggregate of all the data collected within the subdivision must be viewed statistically and as a whole in order to make reliable conclusions about the outage state of the neighborhood.

It is key to note that data collected from a point on the network carries information regarding the outage state of more than just that point. It is statistically correlated with the outage state of the surrounding points, and all points between it and the power source. Thus, while the stochastic nature of the data seems to add uncertainty to an estimate of the outage state, if used properly, it can actually add certainty to the estimate of the outage state of other points on the network.

We propose an algorithm which examines the aggregate of all data collected across a network and uses it to estimate the probability that each point on the network is experiencing an outage. The algorithm is based on a Bayesian model relating the data set to the outage state of the network and relating the outage state at each point on the network to every other point on the network by a graph-based network topology. The sum-product algorithm and max-product algorithm are used to compute the minimum mean square error (MMSE) and maximum a posterior (MAP) estimates of the outage state, respectively. The results of these algorithms can also be used to identify those areas of the network for which the outage state is uncertain. We also propose an algorithm for directing meter interrogations to most quickly resolve those areas of ambiguity.

This document is organized as follows. In Section 2 notation is introduced and the outage detection problem is framed rigorously as an exercise in Bayesian estimation. In Section 3 the sum-product and max-product algorithms are used to solve that problem. In Section 4 the interpretation of data from smart meters capable of responding to interrogations is discussed. In Section 5 the problem is recast in terms of information theory and strategies for optimally reducing uncertainty are discussed. We conclude in Section 6 with a brief summary and an overview of several of the more serious outstanding problems.

2 Problem Statement

A power distribution network can be represented by a graph $G = (V, E)$ where the vertices, $V$, are any electrical devices, branches, or other points on the network and the edges, $E$, are any transmission or distribution lines connecting those points.

Define random process $\theta : E \to \{0, 1\}$ such that $$\theta(e) = \begin{cases} 0 & \text{edge } e \text{ is faulted} \\ 1 & \text{edge } e \text{ is not faulted.} \end{cases} \quad (1)$$

Let us also designate some node $v_s \in V$ as the source node. We can then define random process $x : V \to \{0, 1\}$ such that $$x(v) = \begin{cases} 0 & \text{node } v \text{ is not powered} \\ 1 & \text{node } v \text{ is powered} \end{cases} \quad (2)$$

where a node $v$ is powered if there exists at least one path from $v$ to $v_s$ such that for every edge, $e$, in the path $\theta(e) = 1$. Define $$X \equiv \{x(v) \forall v \in V\} \quad (3)$$

$$\Theta \equiv \{\theta(e) \forall e \in E\}. \quad (4)$$

We consider the problem of estimating $X$ and $\Theta$ given some data set, $D$, where the joint probability density function $p(X, \Theta | D)$ can be defined. Given this function it is possible to compute the marginal probability density function of $x$ and $\theta$ for every node and edge using $$p(x(v)|D) = \sum_{\theta(e) \forall e \in E} \sum_{x(u) \forall u \in V \setminus \{v\}} p(X, \Theta | D) \quad (5)$$

$$p(\theta(e)|D) = \sum_{\theta(f) \forall f \in E \setminus \{e\}} \sum_{x(v) \forall v \in V} p(X, \Theta | D). \quad (6)$$

The MMSE estimates are then $$\hat{x}(v) = \sum_{x(v)} x(v) p(x(v)|D) = p(x(v) = 1|D) \quad (7)$$

$$\hat{\theta}(e) = \sum_{\theta(e)} \theta(e) p(\theta(e)|D) = p(\theta(e) = 1|D). \quad (8)$$

Alternatively, the MAP estimates are given by $$\left(\hat{X}, \hat{\Theta}\right) = \arg\max_{X,\Theta} p(X, \Theta|D). \quad (9)$$

The joint pdf can be factored as $$p(X, \Theta|D) = \frac{p(\Theta, X, D)}{p(D)}$$
$$= \frac{p(D|X, \Theta) p(X, \Theta)}{p(D)}$$
$$\propto p(D|X, \Theta) p(X|\Theta) p(\Theta). \quad (10)$$

This can be further factored as $$p(X, \Theta|D) \propto \prod_{e \in E} \prod_{v \in V} p(d(v)|x(v)) p(d(e)|\theta(e)) p(X|\Theta) p(\theta(e)) \quad (11)$$

which is based on the assumption that $\theta(e)$ for all $e \in E$ are independent, and that the data, $D$, consist of data collected at vertices, $d(v)$ for some $v \in V$ and at edges $d(e)$ for some $e \in E$. The term $p(X|\Theta)$ describes the relationship between nodes and edges. A node $v$ is connected (i.e. $x(v) = 1$) if there is a path from $v$ to $v_s$ consisting of edges $E' \subset E$ such that $\theta(e) = 1$ for all $e \in E'$.

3 Factor Graphs

The number of computations required to compute (5) and (6) is impractically high for most realistic graphs. Calculation of both marginal probabilities require $2^{|E|+|V|-1}$ summations. The sum-product algorithm has been shown to efficiently compute marginal probability densities from joint pdfs with many variables [1],[2]. A factor graph can be derived from the factorization in (11). However, this graph can be further simplified by factoring $p(X|\Theta)$ as $$p(X|\Theta) = p(x(v_1), ..., x(v_N)|\Theta)$$
$$= p(x(v_1)|x(v_2), ..., x(v_N), \Theta) p(x(v_2), ..., x(v_N)|\Theta)$$
$$= p(x(v_1)|x(v_2), ..., x(v_N), \Theta) p(x(v_2), ..., x(v_N)|\Theta, x(v_1)) \quad (12)$$

where the last step follows because $x(v_1)$ is a deterministic function of $\Theta$. This can be further simplified by defining the adjacency list for each node $v \in V$, $$u \in Adj(v) \text{ if and only if } u \text{ and } v \text{ are connected by a single edge.} \quad (13)$$

Similarly, we can define $$edge(u, v) \equiv \begin{cases} e \in E & u \in Adj(v) \\ \varnothing & else \end{cases} \quad (14)$$

where $e$ is the edge connecting node $u$ to node $v$. For simplicity in notation we will use the shorthand $\theta(\text{edge}(u,v)) = \theta(u,v)$. Using these definitions we can write $$p(X|\Theta) = p(x(v_1)|\{x(u), \theta(u,v_1) \forall u \in \text{Adj}(v_1)\}) p(x(v_2),\ldots,x(v_N)|\Theta, x(v_1)) \quad (15)$$

because node $v_1$ is powered only if any of its adjacent nodes are powered and the edge connecting them is not faulted. In this way, unconnected nodes and edges can be removed from the function. Continuing, this pdf may be written $$p(X|\Theta) = p(x(v_s)) \prod_{\substack{v \in V \\ v \neq v_s}} p(x(v)|\{x(u), \theta(u,v) \forall u \in \text{Adj}(v)\}) \quad (16)$$

where $p(x(v_s) = 1) = 1$ and $p(x(v_s) = 0) = 0$. $x(v)$ is a deterministic function of the state of the edges and nodes to which it is directly connected.

(16) may be further simplified for graphs, $G$, which do not contain any cycles. For these graphs there exists a one-to-one function $$\pi : V \setminus \{v_s\} \longrightarrow V \quad (17)$$

such that $\pi(v)$ is the parent vertex of $v$. Since power flows from $v_s$, the parent of $v_s$ is not defined. For each vertex, $v \in V$, $x(v) = 1$ if and only if $x(\pi(v)) = 1$ and $\theta(\pi(v), v) = 1$. Thus (16) reduces to $$p(X|\Theta) = p(x(v_s)) \prod_{\substack{v \in V \\ v \neq v_s}} p(x(v)|x(\pi(v)), \theta(\pi(v), v)) \quad (18)$$

where $$p(x(v) = 1 | x(\pi(v)), \theta(\pi(v), v)) = \begin{cases} 1 & x(\pi(v)) = 1 \text{ and } \theta(\pi(v), v) = 1 \\ 0 & \text{else} \end{cases} \quad (19)$$

A factor graph representing (11), (18), and (19) is obtained by replacing every vertex, $v \in V \setminus v_s$ and $\theta(v, \pi(v))$ with the graph in Fig. 1.

Since this factor graph does not contain cycles it is possible to use it to solve (5), (6), and (9) exactly and in a finite number of iterations. A pseudocode implementation of a message passing algorithm for doing this is given in algorithm 1. This function solves for the entire graph by calling the recursive functions in algorithms 2 and 3. The message passing algorithm is the same for the MAP algorithm as it is for the MMSE algorithm, with the exception that the form of the messages is different. Expressions for these are derived in appendices B.2 and A.2, respectively. Summarizing those results here, for the MMSE algorithm:

$$\text{forwardAnd}(a, b) = a + b - \ln(1 + \exp(a) + \exp(b)) \quad (20)$$

$$\text{backwardAnd}(a, b) = \ln(1 + \exp(a + b)) - \ln(1 + \exp(a)) \quad (21)$$

And for the MAP algorithm:

$$\text{forwardAnd}(a, b) = \min(a + b, b, a) \quad (22)$$

$$\text{backwardAnd}(a, b) = \ln\left(\frac{\max(1, e^{a+b})}{\max(1, e^a)}\right) \quad (23)$$

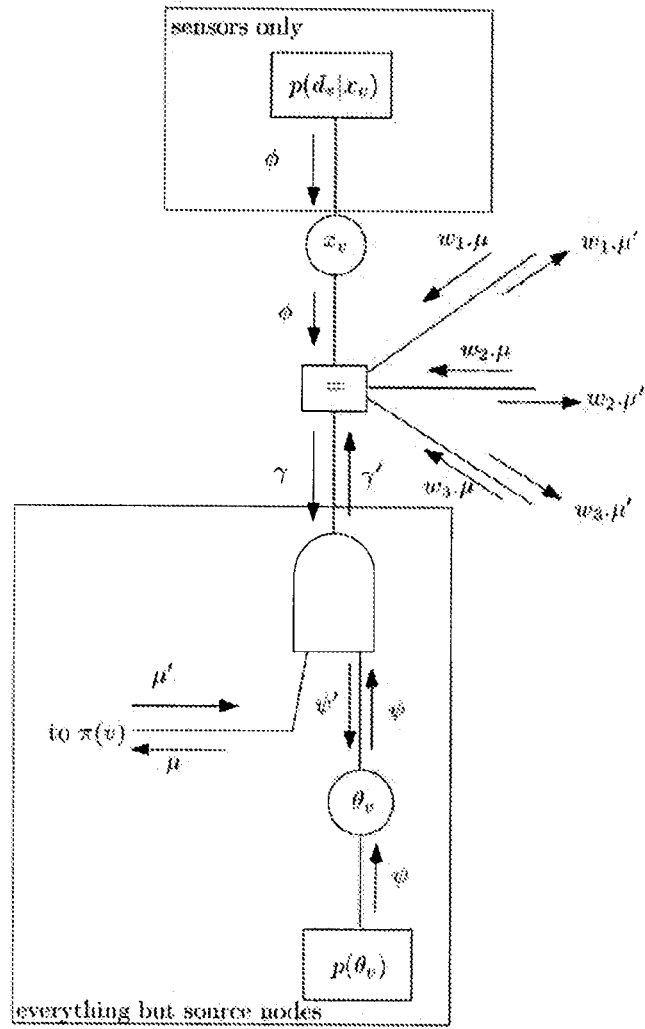

Figure 1: The factor graph is constructed by replacing every node in the power distribution graph with this structure. This is node $v \in V$. $\pi(v)$ is the parent node of $v$ and $w_1, w_2, w_3 \in V$ are the children of $v$. Only nodes that include sensors have the $p(d_v|x_v)$ term. The source node, $v_s \in V$, does not have the AND logic and associated edge variable and does not pass messages to or from a parent node since it has no parent.

Algorithm 1 This algorithm solves for the entire graph.
```
function MP(G, v_s)
    for v ∈ V do
        v.color ← white
    end for
    update(v_s)
    downdate(v_s)
end function
```

Algorithm 2 This recursive function passes messages up from the leaves.
```
function UPDATE(v, e)
    if v.sensor then
        v.φ ← dataIn(v, d(v))                          ▷ See Section 4
    else if v = v_s then
        v.φ ← ∞
    else
        v.φ ← 0
    end if
    v.γ ← v.φ
    v.color ← gray
    [w, f] ← Adj(G, v)
    for i = 1 to length(w) do
        if w_i.color = white then
            update(w_i, f_i)
            v.γ ← v.γ + w_i.μ
        end if
    end for
    if v ≠ v_s then
```
$$v.\psi \leftarrow \ln\left(\frac{1-p(e.\theta_v=0)}{p(e.\theta_v=0)}\right)$$
```
        v.μ ← backwardAnd(v.ψ, v.γ)
    end if
end function
```

Algorithm 3 This recursive function passes messages down the tree from the vertex $v_s$ to the leaves.

```
function DOWNDATE(v, μ', e)
    if v = v_s then
        v.γ' ← 0
    else
        v.ψ' ← backwardAnd(μ', v.γ)
        e.θ ← exp(v.ψ'+v.ψ) / (1+exp(v.ψ'+v.ψ))
        v.γ' ← forwardAnd(μ', v.ψ)
    end if
    L_p ← v.γ + v.γ'
    v.x ← exp(L_p) / (1+exp(L_p))
    v.color ← black
    [w, f] ← Adj(G, v)
    for i = 1 to length(w) do
        if w_i.color = gray then
            downdate(w_i, L_p − w.μ, f_i)
        end if
    end for
end function
```

4 Data models

The data model used to determine $\phi$ in Fig. 1 depends on the sensor installed at node $v$. In this document we will assume that a sensor at node $v$ is detecting a continuous path from $v_s$ to $v$. A continuous path is one in which all the edges, $e$, comprising that path satisfy $\theta(e) = 1$.

4.1 Simple Model

The factorization in (11) demonstrates a model for the problem in which data are collected at nodes and edges throughout the graph. As an example, consider a sensor at each node which has detected connectivity with the source node in $N$ independent trials, $d(v) = \{d_1(v), \ldots, d_N(v)\}$. The model for this may be $$p(d_i(v)|x(v) = 1) = \begin{cases} P_D(v) & d_i(v) = 1 \\ 1 - P_D(v) & d_i(v) = 0 \end{cases} \quad (24)$$

where $P_D(v)$ is the probability that connectivity with the source is detected at node $v$, and $$p(d_i(v)|x(v) = 0) = \begin{cases} P_{FA}(v) & d_i(v) = 1 \\ 1 - P_{FA}(v) & d_i(v) = 0 \end{cases} \quad (25)$$

where $P_{FA}(v)$ is the probability that connectivity is mistakenly detected at node $v$ when connectivity does not exist. From the independence requirement $$p(d(v)|x(v)) = \prod_{i=1}^{N} p(d_i(v)|x(v)). \quad (26)$$

If we denote the message passed from the data to the state node $x(v)$ in Fig. 1 as $\phi(v)$, then $$\begin{aligned} \phi(v) &= \ln \frac{p(d(v)|x(v) = 1)}{p(d(v)|x(v) = 0)} \\ &= \sum_i \ln \frac{p(d_i(v)|x(v) = 1)}{p(d_i(v)|x(v) = 0)} \\ &= \sum_i \alpha_i(v) \end{aligned} \quad (27)$$

where $$\alpha_i(v) = \begin{cases} \ln P_D(v) - \ln P_{FA}(v) & d_i(v) = 1 \\ \ln(1 - P_D(v)) - \ln(1 - P_{FA}(v)) & d_i(v) = 0. \end{cases} \quad (28)$$

4.2 Hidden Markov Model

Consider instead a model in which $x(v)$ is not constant, but rather changing with time. In keeping with the notation above, the state of the vertex $v \in V$ at each time index $i$ may be denoted $x_i(v)$. We are interested in computing $$p(x_N(v)|d_N(v), \ldots, d_1(v)) = \sum_{k=0}^{N-1} \sum_{x_k(v)} p(x_1(v), \ldots, x_N(v)|d_1(v), \ldots, d_N(v)) \quad (29)$$

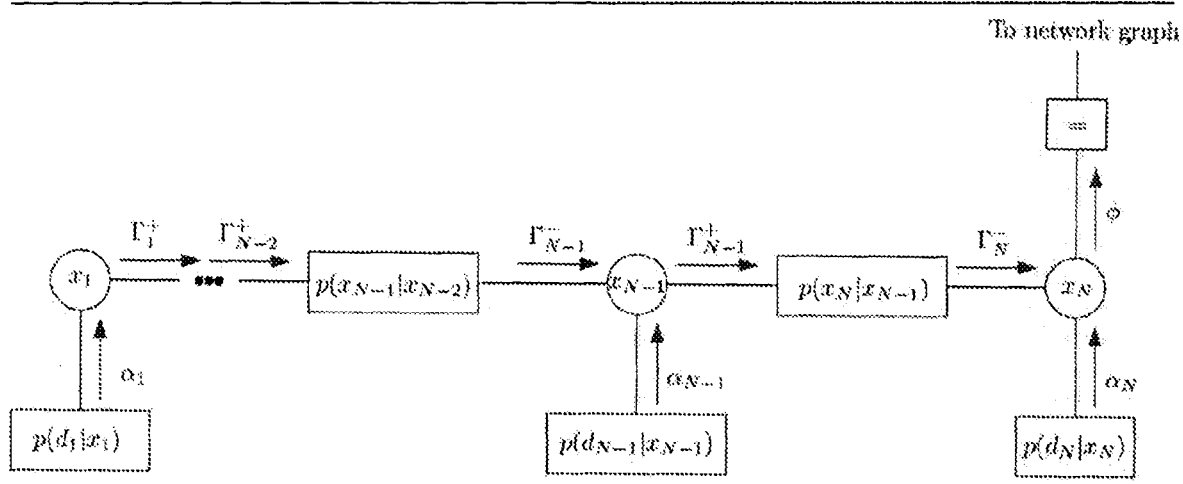

Figure 2: A factor graph for interpreting data received from a sensor using a hidden Markov model.

Then if this variable is changing according to some state transition model $p(x_i(v)|x_{i-1}(v))$, which is known, this equation can be simplified by repeated application of Bayes' theorem:

$$p(x(v)|d(v)) = \frac{p(d(v)|x(v))p(x(v))}{p(d(v))}$$

$$= \frac{\prod_i p(d_i(v)|x_i(v))p(x(v))}{p(d(v))}$$

$$= \frac{1}{p(d(v))} \prod_i p(d_i(v)|x_i(v))p(x_N(v)|x_{N-1}(v),\ldots,x_1(v))p(x_{N-1}(v),\ldots,x_1(v))$$

$$= \frac{1}{p(d(v))} \prod_i p(d_i(v)|x_i(v))p(x_N(v)|x_{N-1}(v))p(x_{N-1}(v),\ldots,x_1(v))$$

$$= \frac{1}{p(d(v))} \prod_i p(d_i(v)|x_i(v)) \prod_{n=2}^{N-1} p(x_n(v)|x_{n-1}(v)) \quad (30)$$

The denominator, being a normalizing constant, can be safely ignored. Fig. 2 is a factor graph representation of this equation. Algorithm 4 is an algorithm for computing the message passed to the network graph based on this factor graph. The function $f$ depends on whether the MMSE or MAP is to be computed. For the MMSE:

$$f(\Gamma^+) = \ln \frac{p_{01} + e^{\Gamma^+}(1 - p_{10})}{(1 - p_{01}) + e^{\Gamma^+} p_{10}}, \quad (31)$$

This is obtained from (50) in Appendix A.1. For the MAP estimate $$f(\Gamma^+) = \ln \left( \frac{\max\left(p_{01}, (1 - p_{10})e^{\Gamma^+}\right)}{\max\left((1 - p_{01}), p_{10}e^{\Gamma^+}\right)} \right) \quad (32)$$

which is obtained from (65) in Appendix B.1.

The advantage of this method over that of (27) is that it reacts to changes in the network better. For networks in which the fault conditions do not change (27) is sufficient. However, if

```
Algorithm 4 An algorithm for computing φ in Fig 3.
function DATAIN(v, d)
    for n = 1 to N do
        if d_n(v) = ∅ then                          ▷ No data collected at v for interval n
            α_n ← 0
        else if d_n(v) = 0 then
            α_n ← ln(1 − P_D(v)) − ln(1 − P_FA(v))
        else
            α_n ← ln P_D(v) − ln P_FA(v)
        end if
        if n = 1 then
            Γ_n^- ← 0
        else
            Γ_n^- ← f(Γ_{n−1}^+)                    ▷ Expression different for MMSE or MAP estimate
        end if
        Γ_n^+ ← Γ_n^- + α_n
    end for
    φ(v) ← Γ_N^+
end function
``` the value of $x(v)$ were to change during the observation interval the assumptions used to derive that equation would no longer hold. Care must be taken in using algorithm 4, though, to ensure that the values $p_{10}$ and $p_{01}$ accurately reflect the probability of $x(v)$ to change.

5 A feedback algorithm for solicited communications

It may be that data can be collected for only a proper subset of vertices in $V$ at any one time. This begs the question, given the current estimate of $\hat{x}(v) \forall v \in V$ and $\hat{\theta}(e) \forall e \in E$, what are the best vertices from which to gather data? One may use the joint entropy $H(X, \Theta|D)$ as a metric for measuring the degree to which the state of the network is known.

Because the value of $\Theta$ completely determines the value of $X$, it can be shown that $$H(X, \Theta|D) = H(\Theta|D) = \sum_{e \in E} H(\theta(e)|D) \tag{33}$$

where the last equality follows because $\theta(e)$ and $\theta(f)$ are independent for all $e, f \in E$ and $e \neq f$. We may phrase the question at hand as one of finding the node $v \in V$ for which knowledge of $x(v)$ will provide the greatest reduction in $H(\Theta)$. That is $$v_{opt} = \arg\min_{v \in V} H(X \setminus x(v), \Theta|x(v), D). \tag{34}$$

A problem with this formulation is that it does not account for the fact that data collected from a vertex $v$ will not give perfect information regarding $x(v)$. It is, however, instructive to consider this optimization function as it shows which vertices are the most critical to gather data on given the current data set. From information theory we know that $$H(X \setminus x(v), \Theta|x(v), D) = H(X, \Theta|D) − H(x(v)|D)$$
$$= H(\Theta|D) − H(x(v)|D). \tag{35}$$

Thus $$v_{opt} = \arg\min_{v \in V} H(X \setminus x(v), \Theta | x(v), D) = \arg\max_{v \in V} H(x(v)|D). \qquad (36)$$

This shows that knowledge of vertex $v$ where the entropy of $x(v)$ given the current estimate of $x(v)$ from the existing data set is greatest, will provide the best reduction in uncertainty to the graph as a whole.

In general for a subset of vertices $V_0 \subset V$, the subset which best minimizes the uncertainty in the estimate is given by $$V_{opt} = \arg\min_{V_0 \subset V} H(\{x(u) : u \in V \setminus V_0\}, \Theta | \{x(v) : v \in V_0\}, D). \qquad (37)$$

By the same procedure as above this is equivalent to $$V_{opt} = \arg\max_{V_0 \subset V} H(\{x(v) : v \in V_0\}|D). \qquad (38)$$

Note that in general $$H(\{x(v) : v \in V_0\}|D) \ne \sum_{v \in V_0} H(x(v)|D). \qquad (39)$$

Therefore, one cannot simply select the $|V_0|$ vertices with the largest entropy. An algorithm for solving (38) is an area of continuing research. Given current understanding, we suggest focusing data collections on vertices for which $H(x(v))$ is large.

6 Conclusions and future research

Observe that by the information theoretic formulation in Section 5 any data source is a useful source if $$H(X, \Theta|D) < H(X, \Theta). \qquad (40)$$

The problem we have discussed as formulated in Section 2 and solved generally in Section 3 works for any data source, $D$. It is only in Section 4 that we have considered a specific kind of data set. In general, so long as a model for $p(x(v)|d(v))$ and $p(\theta(v)|d(v))$ exists, messages $\phi(v)$ as illustrated in Fig. 1 can be formulated and the MMSE or MAP estimate computed.

We note that the solution provided works only for graphs $G = (V, E)$ without cycles. If for any $v \in V$ there exists multiple paths from $v$ to $v_s$, then the solution in Section 3 does not apply. The sum-product and max-product algorithms are known to work precisely on factor graphs without cycles. On factor graphs that have at least one cycle, though, there is no such guarantee. However, there has been some research into algorithms which will either yield a precise response with some modification or which yield an approximate result. Research into these methods as they pertain to this problem continues.

We also note that in Section 4 $P_D(v)$ and $P_{FA}(v)$ were assumed known. In practice, this is unlikely to be the case since differences in the communication channel properties (e.g. SNR) are likely to cause detection probabilities to be different for each $v \in V$. One possible solution is to solve the graph using the algorithms as presented in this paper. However, after that is completed, messages can be passed back through the graph in Fig. 2, providing improved estimates of $x_t(v)$. This can be used to give a more precise estimate for the state of each vertex at each time. In fact, one could implement a message-passing algorithm for doing exactly this. With such an algorithm $P_D(v)$ and $P_{FA}(v)$ should be easily estimated. Since real-valued parameters are being estimated it is likely the sum-product algorithm will be of more use than the max-product algorithm. This is also an area of continuing research.

We propose implementing the algorithm as described in this paper on a real network as soon as possible. The data obtained from that exercise can be used to validate this algorithm's utility, and will also be invaluable in solving those still extant problems outlined above.

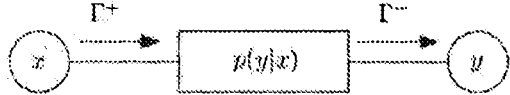

Figure 3: A factor graph representing a state transition.

A  Sum-product messages

A.1  Bernoulli state transitions

We consider the factor graph in Fig. 3 in which two Bernoulli random variables are connected to a functional node. We seek an equation relating $\Gamma^-$ to $\Gamma^+$. By the sum-product algorithm $$\Gamma^-(y) = \sum_{x=0}^{1} \Gamma^+(x) p(y|x) \tag{41}$$

$$= \Gamma^+(0) p(y|x=0) + \Gamma^+(1) p(y|x=1). \tag{42}$$

We define $$p(y=0|x=0) = 1 - p_{01} \qquad p(y=0|x=1) = p_{10} \tag{43}$$

$$p(y=1|x=0) = p_{01} \qquad p(y=1|x=1) = 1 - p_{10}. \tag{44}$$

Therefore $$\Gamma^-(0) = \Gamma^+(0)(1 - p_{01}) + \Gamma^+(1) p_{10} \tag{45}$$

$$\Gamma^-(1) = \Gamma^+(0) p_{01} + \Gamma^+(1)(1 - p_{10}). \tag{46}$$

We shall use the notation where a message expressed without an argument represents a log-likelihood ratio, and with an argument represents a probability density function. Thus, for example, $$\Gamma^- \equiv \ln\left(\frac{\Gamma^+(1)}{\Gamma^+(0)}\right) \tag{47}$$

$$= \ln\left(\frac{1 - \Gamma^+(0)}{\Gamma^+(0)}\right)$$

where the second equality holds $\Gamma^+$ is a message passed along an edge connected to a Bernoulli random variable. Inverting the above we get $$\Gamma^-(0) = \frac{1}{1 + \exp(\Gamma^+)} \tag{48}$$

$$\Gamma^-(1) = \frac{\exp(\Gamma^+)}{1 + \exp(\Gamma^+)}. \tag{49}$$

Thus by this convention, (45) and (46) become $$\Gamma^- = \ln \frac{\Gamma^+(0) p_{01} + \Gamma^+(1)(1 - p_{10})}{\Gamma^+(0)(1 - p_{01}) + \Gamma^+(1) p_{10}}$$

$$= \ln \frac{p_{01} + e^{\Gamma^+}(1 - p_{10})}{(1 - p_{01}) + e^{\Gamma^+} p_{10}} \tag{50}$$

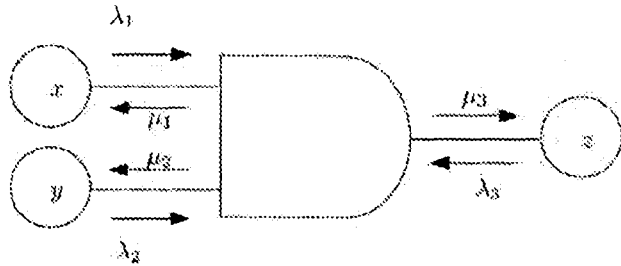

Figure 4: A factor graph representing a logical AND requirement between three Bernoulli random variables.

A.2 Sum-product messages for logical AND gates

We consider the functional node of a factor graph illustrated in 4, represented by a logical AND gate. Each of the edges here are connected to variable nodes representing Bernoulli random variables. This represents the function $$\text{AND}(x,y,z) = \begin{cases} 1 & x = 1 \text{ AND } y = z \\ 0 & \text{else}. \end{cases} \quad (51)$$

We first derive the output message $\mu_3$ given the input messages $\lambda_1$ and $\lambda_2$. By the sum product algorithm the output, $\mu_3$, is $$\mu_3(z) = \sum_x \sum_y \lambda_1(x)\lambda_2(y) AND(x,y,z). \quad (52)$$

Expanding the summation we get $$\mu_3(0) = \lambda_1(0)\lambda_2(0) + \lambda_1(1)\lambda_2(0) + \lambda_1(0)\lambda_2(1) \quad (53)$$

and $$\mu_3(1) = \lambda_1(1)\lambda_2(1). \quad (54)$$

Invoking the definition in (47) the log-likelihood ratio is therefore $$\mu_3 = \ln\left(\frac{\lambda_1(1)\lambda_2(1)}{\lambda_1(0)\lambda_2(0) + \lambda_1(1)\lambda_2(0) + \lambda_1(0)\lambda_2(1)}\right)$$
$$= \ln\left(\frac{\exp(\lambda_1 + \lambda_2)}{1 + \exp(\lambda_1) + \exp(\lambda_2)}\right)$$
$$= \lambda_1 + \lambda_2 - \ln(1 + \exp(\lambda_1) + \exp(\lambda_2)). \quad (55)$$

Given $\lambda_1$ and $\lambda_3$ the message $\mu_2$ is also given by the sum-product algorithm:

$$\mu_2(y) = \sum_x \sum_z \lambda_1(x)\lambda_3(z) AND(x,y,z). \quad (56)$$

Expanding the summations as before we get $$\mu_2(0) = \lambda_1(0)\lambda_3(0) + \lambda_1(1)\lambda_3(0) \quad (57)$$

and $$\mu_2(1) = \lambda_1(0)\lambda_3(0) + \lambda_1(1)\lambda_3(1). \quad (58)$$

The log-likelihood ratio is therefore $$\mu_2 = \ln\left(\frac{\lambda_1(0)\lambda_3(0) + \lambda_1(1)\lambda_3(1)}{\lambda_1(0)\lambda_3(0) + \lambda_1(1)\lambda_3(0)}\right)$$

$$= \ln\left(\frac{1 + \exp(\lambda_1 + \lambda_3)}{1 + \exp(\lambda_1)}\right) \quad (59)$$

$$= \ln(1 + \exp(\lambda_1 + \lambda_3)) - \ln(1 + \exp(\lambda_1)). \quad (60)$$

B  Max-product messages

B.1  Bernoulli state transitions

We repeat the derivation of Appendix A.1 for the max-product algorithm. Referencing Fig. 3, by application of the max-product algorithm we get $$\Gamma^-(y) = \max_x p(y|x)\Gamma^+(x)$$

$$= \max\left(p(y|x=0)\Gamma^+(0), p(y|x=1)\Gamma^+(1)\right). \quad (61)$$

Using the state transition probabilities defined in (43) and (44) we get $$\Gamma^-(0) = \max\left((1-p_{01})\Gamma^+(0), p_{10}\Gamma^+(1)\right) \quad (62)$$

$$\Gamma^-(1) = \max\left(p_{01}\Gamma^+(0), (1-p_{10})\Gamma^+(1)\right). \quad (63)$$

Now by the definition in (47)

$$\Gamma^- = \ln\left(\frac{\max\left(p_{01}\Gamma^+(0), (1-p_{10})\Gamma^+(1)\right)}{\max\left((1-p_{01})\Gamma^+(0), p_{10}\Gamma^+(1)\right)}\right) \quad (64)$$

which, by the appropriate substitutions simplifies to $$\Gamma^- = \ln\left(\frac{\max\left(p_{01}, (1-p_{10})e^{\Gamma^+}\right)}{\max\left((1-p_{01}), p_{10}e^{\Gamma^+}\right)}\right). \quad (65)$$

B.2  Max-product messages for logical AND gates

We repeat the derivation of Appendix A.2 for the max-product algorithm. To derive the message $\mu_3$ in Fig. 4 we use the max-product formulation $$\mu_3(z) = \max_{x,y} \lambda_1(x)\lambda_2(y) \operatorname{AND}(x, y, z). \quad (66)$$

This gives $$\mu_3(0) = \max\left(\lambda_1(0)\lambda_2(0), \lambda_1(1)\lambda_2(0), \lambda_1(0)\lambda_2(1)\right) \quad (67)$$

$$\mu_3(1) = \max\left(\lambda_1(1)\lambda_2(1)\right). \quad (68)$$

The log-likelihood ratio is then $$\mu_3 = \ln\left(\frac{\mu_3(1)}{\mu_3(0)}\right)$$
$$= \ln\left(\frac{\lambda_1(1)\lambda_2(1)}{\max(\lambda_1(0)\lambda_2(0), \lambda_1(1)\lambda_2(0), \lambda_1(0)\lambda_2(1))}\right)$$
$$= \ln\min\left(\frac{\lambda_1(1)\lambda_2(1)}{\lambda_1(0)\lambda_2(0)}, \frac{\lambda_1(1)\lambda_2(1)}{\lambda_1(1)\lambda_2(0)}, \frac{\lambda_1(1)\lambda_2(1)}{\lambda_1(0)\lambda_2(1)}\right)$$
$$= \ln\min\left(\frac{\lambda_1(1)\lambda_2(1)}{\lambda_1(0)\lambda_2(0)}, \frac{\lambda_2(1)}{\lambda_2(0)}, \frac{\lambda_1(1)}{\lambda_1(0)}\right)$$
$$= \min(\lambda_1 + \lambda_2, \lambda_2, \lambda_1) \qquad (69)$$

Messages out of the AND gate inputs are determined using $$\mu_2(y) = \max_{x,z} \lambda_1(x)\lambda_3(z)\,\text{AND}(x,y,z) \qquad (70)$$

which gives $$\mu_2(0) = \max(\lambda_1(0)\lambda_3(0), \lambda_1(1)\lambda_3(0)) \qquad (71)$$
$$\mu_2(1) = \max(\lambda_1(0)\lambda_3(0), \lambda_1(1)\lambda_3(1)). \qquad (72)$$

This gives a log-likelihood ratio $$\mu_2 = \ln\left(\frac{\max(\lambda_1(0)\lambda_3(0), \lambda_1(1)\lambda_3(1))}{\max(\lambda_1(0)\lambda_3(0), \lambda_1(1)\lambda_3(0))}\right)$$
$$= \ln\left(\frac{\max(1, e^{\lambda_1+\lambda_3})}{\max(1, e^{\lambda_1})}\right) \qquad (73)$$

What is claimed is:

1. A system for detecting faults in a power distribution network, comprising:
one or more sensing devices coupled to the power distribution network, the sensing devices receiving data from the power distribution network, and the power distribution network including a plurality of nodes;
a memory device coupled to the one or more sensing devices including a data management module, the data management module storing the received data from the one or more sensing devices;
a user interface including a display and at least one user interaction component;
a processing device including a processor, coupled to the memory device, the processing device including a processor programmed to execute;
a query module;
a probability estimation module;
a feedback module; and,
a reporting module;
wherein the query module retrieves data from the memory device by querying the data management module and transmits the retrieved data to a probability estimation module;
wherein the probability estimation module receives the data transmitted by the query module and, based at least upon the data, generates probabilistic information about the state of at least one of the nodes within the power distribution network;
wherein the feedback module produces additional probabilistic information by directing further, targeted data collection within the power distribution network by the sensing devices
by causing a concentrator device to inject a very low frequency (VLF) signal to the power distribution network,
by using the sensing devices to detect the very low frequency signal at a node from a targeted group of nodes, and
by causing the sensing devices to produce additional probabilistic information based on the detecting of the very low frequency signal at the node from the targeted group of nodes;
wherein the reporting module induces the user interface to display the additional probabilistic information to a human user; and,
wherein the at least one user interaction component enables the human user to interact with the system based at least upon the displayed additional probabilistic information.

2. The system of claim 1, wherein the probability estimation module generating probabilistic information about the state of at least one of the nodes comprises determining, based at least upon the received data, a first estimated probability that each node of the plurality of nodes of the power distribution network is powered via a probability estimation module.

3. The system of claim 2, wherein the probability estimation module further determines, based on the received data, a second estimated probability that each transmission line of a plurality of transmission lines connecting the plurality of nodes is faulted via the probability estimation module.

4. The system of claim 3, wherein the reporting module further generates a distribution map comprising the plurality of nodes and the plurality of transmission lines, and induces the user interface to display the distribution map to the human user.

5. The system of claim 4 wherein the reporting module, before displaying the probabilistic information to the human user, assigns a first visual characteristic to each node of the plurality of nodes based on the first estimated probability for the corresponding node.

6. The system of claim 5 wherein the reporting module, before displaying the probabilistic information to the human user, assigns a second visual characteristic to each transmission line of the plurality of transmission line based on the second estimated probability for the corresponding transmission line.

7. The system of claim 3, wherein:
determining the first estimated probability comprises calculating a first marginal probability density function from a joint probability density function conditioned on the data; and
determining the second estimated probability comprises calculating a second marginal probability density function from the joint probability density function conditioned on the data.

8. The system of claim 7, wherein the first marginal probability density function and the second marginal probability density function are each calculated using a sum-product algorithm.

9. The system of claim 3, wherein determining the first estimated probability and the second estimated probability further comprises calculating messages to be sent via the transmission lines between the nodes of a graph representative of the network.

10. The product of claim 9, wherein the calculation and sending of messages between the nodes and transmission lines of the graph representative of the network occurs repeatedly until the message values that are sent via the transmission lines between the nodes converge to stable values.

11. The system of claim 9, wherein the messages comprise probability density functions.

12. The system of claim 2, wherein executing the feedback module comprises
determining that the first estimated probability is uncertain; and,
providing feedback to the one or more sensing devices to collect data from the at least one node corresponding to the uncertain first estimated probability.

13. The system of claim 2, wherein executing the feedback module comprises
determining that the first estimated probability is uncertain; and,
providing feedback to the one or more sensing devices to collect data from at least one neighboring node of the at least one node corresponding to the uncertain first estimated probability.

14. The system of claim 1, wherein the sensing devices comprise at least one of:
voltage sensors;
electric current sensors,
electrical resistance sensors,
electrical conductance sensors,
electrical reactance sensors,
electrical susceptance sensors,
magnetic flux sensors,
electrical power sensors,
capacitance sensors,
electrical impedance sensors, electrical admittance sensors,
phase characteristics sensors,
PWM frequency sensors,
VLF sensors;
magnetic inductance sensors;
infrared sensors; and,
infrared cameras.

15. A method for detecting faults in a power distribution network, comprising:
  using a concentrator device to transmit a signal to a plurality of nodes in the power distribution network;
  using at least one central processing device, to which the plurality of nodes are in communication, to monitor the plurality of nodes and to detect that at least one node of the plurality of nodes received the signal;
  using the at least one central processing unit to determine, based on the detection that at least one of the plurality of nodes received the signal, a first estimated probability that each node of the plurality of nodes is powered;
  using the at least one central processing unit to determine, based on the detection that at least one of the plurality of nodes received the signal, a second estimated probability that each distribution line of a plurality of distribution lines connecting the plurality of nodes is faulted;
  using the at least one central processing unit to identify, based on the second estimated probability, a targeted group of nodes;
  using the concentrator device to inject, based on the second estimated probability, a very low frequency (VLF) signal into the power distribution network;
  using at least the one central processing unit to direct a targeted data collection at the targeted group of nodes within the power distribution network by detecting the very low frequency signal at a node from the targeted group of nodes via a plurality of sensing devices coupled to the power distribution network;
  using the at least one central processing unit to generate, based on the targeted data collection, a distribution map comprising the plurality of nodes and the plurality of transmission lines and which indicates whether each of the plurality of nodes is powered and whether each of the plurality of transmission lines is faulted; and,
  using the at least one central processing unit to cause a user interface comprising a display and at least one user interaction component to display the distribution map to a human user, wherein the at least one user interaction component enables the human user to interact with the at least the power distribution network based at least upon the displayed distribution map.

16. The method of claim 15, wherein using the at least one central processing device to detect that at least one node out of the plurality of nodes received the signal comprises using the at least one central processing device to detect a node attribute indicative of a receipt of the transmitted signal in the at least one node out of the plurality of nodes.

17. The method of claim 16, wherein using the detector device to notify the central processing unit that the detector device received the signal having a unique identifier comprises communicating a value, flag, or attribute indicating that the signal having the unique identifier was received by the node.

18. The method of claim 15, wherein using the at least one central processing device to detect that at least one node out of the plurality of nodes received the signal comprises using the at least one central processing device to detect a change in at least one node attribute, the change being indicative of a receipt of the transmitted signal in the at least one node out of the plurality of nodes.

19. The method of claim 15, wherein using a concentrator to transmit a signal comprises using the concentrator device to transmit at least one signal having a unique identifier and wherein using the at least one central processing device to detect that at least one node out of the plurality of nodes received the signal comprises using a detector device at the at least one node to detect and decode the signal having the unique identifier and further using the detector device to notify the central processing unit that the detector device received and decoded the signal having the unique identifier.

20. The method of claim 15, wherein using the central processing device to determine a first estimated probability that each node of the plurality of nodes is powered comprises using the central processing device to determine a detection rate for at least one node in the plurality of nodes, and to determine a probability that at least one of the plurality of nodes received the signal based at least upon the determined detection rate.

* * * * *